United States Patent [19]

Cohen et al.

[11] Patent Number: 4,859,571

[45] Date of Patent: Aug. 22, 1989

[54] EMBEDDED CATALYST RECEPTORS FOR METALLIZATION OF DIELECTRICS

[75] Inventors: Abraham B. Cohen, Springfield; Roxy Fan, E. Brunswick; John A. Quinn, Morganville, all of N.J.

[73] Assignee: E. I. Du Pont de Nemours and Company, Wilmington, Del.

[21] Appl. No.: 947,833

[22] Filed: Dec. 30, 1986

[51] Int. Cl.[4] .................. G03C 1/78; G03C 1/94; G03C 1/96

[52] U.S. Cl. .................... 430/272; 430/278; 430/271; 430/276; 430/311; 430/279; 427/302

[58] Field of Search .............. 430/278, 271, 272, 276, 430/279, 311; 427/302

[56] References Cited

U.S. PATENT DOCUMENTS

| | | | |
|---|---|---|---|
| 3,259,559 | 7/1966 | Schneble, Jr. et al. | 204/38 |
| 3,330,695 | 7/1967 | Curran | 117/212 |
| 3,391,455 | 7/1968 | Hirohata et al. | 29/625 |
| 3,506,482 | 4/1970 | Hirohata et al. | 117/212 |
| 3,546,011 | 12/1970 | Knorre et al. | 117/212 |
| 3,625,758 | 12/1971 | Stahl et al. | 117/212 |
| 3,822,128 | 7/1974 | Wainer et al. | 96/38.4 |
| 3,993,802 | 11/1976 | Polichette et al. | 430/413 X |
| 4,054,479 | 10/1977 | Peiffer | 156/280 |
| 4,054,483 | 10/1977 | Peiffer | 156/632 |
| 4,110,147 | 8/1978 | Grunwald et al. | 156/306 |
| 4,152,477 | 5/1979 | Haruta et al. | 428/209 |
| 4,229,518 | 10/1980 | Gray et al. | 430/273 |
| 4,287,253 | 9/1981 | Leech | 428/323 |
| 4,292,389 | 9/1981 | Kojima et al. | 430/169 |
| 4,454,168 | 6/1984 | Fritz | 427/96 |
| 4,478,883 | 10/1984 | Bupp et al. | 427/97 |
| 4,501,810 | 2/1985 | Fromson et al. | 430/302 |
| 4,507,383 | 3/1985 | Tsuruta et al. | 430/272 X |
| 4,567,062 | 1/1986 | Fan | 427/96 |

FOREIGN PATENT DOCUMENTS 5548472 12/1980 Japan.

OTHER PUBLICATIONS

C. F. Coombs, Jr.; Ed., "Plating," *Printed Circuits Handbook*, 1979, Chp. 7.

J. A. Scarlett, *Printed Circuit Boards for Microelectronics*, 1980 Chp. 4.

J. A. Scarlett, ed., *The Multilayer Printed Circuit Board Handbook*, 1985, Chp. 12.

*Primary Examiner*—Paul R. Michl
*Assistant Examiner*—Cynthia Hamilton

[57] ABSTRACT

The invention is directed to a laminate for the preparation of printed circuits by electroless plating of conductive metal thereon which comprises a. an electrically insulative substrate bearing b. an adherent layer of crosslinked polymeric adhesive, which is insoluble in photodielectric developing solutions, having partially embedded therein finely divided particles of adsorbent which protrude from the adhesive surface away from the substrate, the protrusive surfaces of which are adsorptive with respect to electroless plating catalysts or reductive precursors thereof, and c. a solid layer of photodielectric adherently overlying the layer of adhesive and adsorbent particles.

15 Claims, 2 Drawing Sheets

EMBEDDED CATALYST RECEPTORS FOR METALLIZATION OF DIELECTRICS

FIELD OF THE INVENTION

The invention is directed to laminates having embedded catalyst receptors which make them particularly suitable for metallization, especially by electroless means.

BACKGROUND OF THE INVENTION

The preparation of printed circuit boards by electroless plating procedures is known, such as those disclosed in "Printed Circuits Handbook", Second Edition, edited by C. F. Coombs, Jr., published by McGraw-Hill Book Co., New York, NY, 1979, Chapter 7; in "Printed Circuit Boards for Microelectronics". Second Edition, by J. A. Scarlett, published by Electrochemical Publications, Ltd., Ayr, Scotland, 1980, Chapter 4 and in "The Multilayer Printed Circuit Board Handbook". edited by J. A. Scarlett, published by Electrochemical Publications, Ltd., Ayr, Scotland. 1985, Chapter 12.

Using electroless plating procedures, various techniques are known to enhance adhesion between substrate and plated metal and to define circuit lines, vias and pads.

Enhancing adhesion by plating onto surfaces roughened mechanically, chemically or by other means is common. In one method, disclosed in U.S. Pat. No. 4,110,147, microscopic pores are replicated in the surface of a thermoset plastic substrate by laminating it to microporous anodized aluminum. The aluminum is removed chemically prior to catalyzing and plating. The method is thus limited to thermoset substrates and requires the added expense and effort of anodizing, laminating and removing the aluminum foil.

In another method, disclosed in U.S. Pat. No. 3,330,695, hard, sharp edged, inert, inorganic dielectric powders, such as aluminum oxide or quartz, are embedded at elevated temperature into a polymeric layer and produce a rough surface from the many interstices present. There is no suggestion that particle microporosity is important or that the particles applied are capable of accepting electrolessly deposited metal; only vacuum sputtering or spraying molten metal is taught. Because of the high temperatures involved, applicability of the method to a wide variety of plastic substrates is uncertain.

A chemical method for roughening a plastic substrate to improve adhesion for electroless plating is the well known "swell and etch" technique. The substrate is treated with a solvent or solvent mixture that will swell, but not dissolve the material. In the swollen condition, the panel is chemically etched with oxidizing reagents such as hot chromic-sulfuric acid to create pits on the surface. The surface-roughened substrate is then screen printed or photoimaged with a resist by known procedures, sensitized and/or catalyzed and electrolessly plated. Alternatively, the resist can be applied after the catalyzing step. With this approach, the degree of plated metal adhesion can be limited depending on the effectiveness of the roughening step, which must be tailored to each different substrate material. The swell and etch technique uses solvents that are volatile and require special procedures and equipment for controlling fumes during application and drying. The hot oxidizing solution is corrosive and hazardous. Further, during the sensitization and catalysis steps, any resist used to define the circuit pattern can pick up catalyst on its surface which leads to unwanted extraneous plating, forms nodules or even short circuits and will thus limit the circuit line resolution that can be reliably achieved. If, on the other hand, the entire substrate surface is catalyzed before applying the circuit-defining resist, then the resist must by stripped and the underlying catalytic agents thoroughly removed to prevent the possibility of electrical breakdown when high density circuits are made by this method.

Special cationic copolymers for promoting attachment of negatively charged catalyst species are recommended for treating substrates prior to catalysis in U.S. Pat. No. 4,478,883. While effective for the particular catalytic species specified, it is uncertain how many other catalytic types would be usable.

Another technique for surface roughening prior to circuit pattern formation is suggested in U.S. Pat. Nos. 3,625,758 and 3,546,011. The dielectric substrate contains uniformly dispersed materials, organic or inorganic, which are attacked by oxidizing or caustic reagents and preferentially etched out from the substrate to form the rough surface needed for plating. In U.S. Pat. No. 4,152 477, a butadiene-based rubber adhesive is etched away from hardened phenolic resin microcapsules dispersed in the rubber to provide increased surface area from the presence of the high number of small particles exposed. A characteristic of all these etch-out approaches is that the substrate or adhesive is limited to a narrow range of fillers or matrix materials, thus limiting applicability to a narrow range of substrates, or compromising other properties needed by high performance circuits.

In another approach, e.g., in U.S. Pat. Nos. 3,259,559 and 4,287,253, particulate materials suitable for catalyzing electroless deposition are uniformly dispersed in a polymeric matrix and molded into a dielectric substrate containing uniformly dispersed catalytic sites. Alternatively, such a mixture of polymer and catalyst can be applied as a separate adhesive layer to a dielectric substrate. A resist may be applied to define the circuit before plating. In this method, ionic or metallic species are left permanently on the substrate next to the plated circuit lines. This is unsatisfactory for high density circuits which need better and better dielectric materials for high speed microelectronic applications to prevent electrical breakdown. Also, unless very high catalyst loading is used, the available catalytic sites cover a relatively low fraction of the surface area. This leads to fewer bonding sites per unit area which restricts the adhesive strength obtained by the plated circuit.

In still another method, such as described in U.S. Pat. Nos. 3,391,455 and 3,506,482, the dielectric substrate is imagewise screen printed with an adhesive composition. The resulting adhesive circuit image is rendered catalytic by toning with copper powder. Because image formation is based on screen printing, plated line resolution is inherently low, the resulting circuits have unstraight sidewalls and are thus primarily suitable for lower quality uses or in applications that require only thin conductor layers.

Printed circuits can also be prepared by applying powdered material such as particulate metals onto surfaces having imagewise tacky and nontacky areas. Representative methods are disclosed in U.S. Pat. Nos. 4,054,479, 4,054,483 and 4,454,168. After the particulate metal is applied and unwanted particles are removed, the circuits are formed by one of several additive techniques including electroless plating. Without a separate resist to define circuit line sidewalls, the best applications for this approach are also thin copper layers or low density circuitry.

Methods for imaging without use of resists are known. U.S. Pat. No. 3,822,128 is directed to electroless plating of conductive metal onto a microporous anodized aluminum surface which has been made imagewise catalytic by photoforming metallic silver in the anodized layer. In Japanese patent Application publication 55-48,472, a conductive circuit is prepared on a dielectric substrate by applying titanium dioxide powder to an adhesive layer previously coated on the substrate, creating a latent image on the titanium dioxide layer by imagewise ultraviolet exposure to a circuit pattern, forming metallic silver plating catalyst on the exposed titanium dioxide particles by treatment with silver nitrate solution, electrolessly plating copper on the catalyzed areas and then curing the adhesive. These approaches suffer from the obvious restriction of being limited to specific materials, an anodized aluminum substrate or titanium dioxide layer. In addition, without the presence of a resist to contain plating, circuit applications would be primarily the lower quality, low definition applications.

It is an object of this invention to provide a process for making printed circuit boards, using the electroless plating technique, that results in excellent adhesion and is readily adaptable to achieve high adhesion on a wide variety of substrates—organic, ceramic or metal. It is a particular object to provide a process that is suitable for developing good adhesion on high performance circuit board substrates such as those having low dielectric constant or other desirable properties such as strength, flexibility, or resistance to high temperatures, chemical or environmental attack. It is also an object to achieve high adhesion on such substrates but not require special additives or fillers in the substrate composition that could compromise electrical, physical, thermal or chemical resistance properties of the finished circuit.

It is another object of the invention to provide a process suitable for the highest circuit line definition, for example, circuit lines 0.001 to 0.002 inches (25.4 to 50.8 microns) wide, 0.001 to 0.002 inches (25.4 to 50.8 microns) high with straight sidewalls. These demanding requirements are important in high performance circuits to prevent impedance difficulties that might otherwise ensue.

It is still another object of this invention to provide a process that leaves no trace of metallic or ionic residues on the substrate to cause low resistivity between the conductor lines, thus making the process suitable for producing fine line, high performance circuitry not subject to electrical breakdown, particularly at high voltages or high temperature and humidity conditions.

Finally, it is an object of the invention to provide a method for making circuits that are ideal for use in producing multilayer circuit boards using existing lamination techniques because their smooth circuit surfaces require only thin adhesive layers between individual boards and minimum pressure in the lamination stage.

BRIEF DESCRIPTION OF THE INVENTION

In its primary aspect, the invention is directed to a laminate for the preparation of printed circuits by electroless plating of conductive metal thereon which comprises a. a substrate at least one surface of which has b. an adherent layer of crosslinked polymeric adhesive, which is resistant to photodielectric developing solutions, having partially embedded therein finely divided particles of adsorbent which protrude from the adhesive surface away from the substrate, the protrusive surfaces of which are adsorptive with respect to electroless plating catalysts or reductive precursors thereof but nonadsorptive with respect to photodielectric materials, and c. a solid layer of photodielectric adherently overlying the layer of adhesive and adsorbent particles.

The above-described laminate can then be used to form an electrolessly plated printed circuit by the sequential steps of (1) imagewise exposing the photodielectric surface of the above-described laminate to actinic radiation to effect a solubility change in the light-exposed image areas of the photodielectric;

(2) removing the soluble image areas of the photodielectric by solvent development thus exposing the underlying protrusive adsorbent particles;

(3) adsorbing onto the particle surfaces an electroless plating catalyst with or without a previous step using a reductive precursor thereof; and (4) electrolessly plating conductive metal onto the adsorbate.

In a secondary aspect, the invention is directed to a laminate for the preparation of printed circuits by electroless plating of conductive metal thereon which comprises a. a substrate bearing b. an adherent layer of polymeric adhesive having partially embedded therein finely divided particles of adsorbent which particles protrude from the adhesive surface away from the substrate and have adsorbed thereon an electroless plating catalyst, and c. an electrolessly plated layer of conductive metal, or alternatively, a conductive layer that is formed by first electrolessly plating then electroplating.

The above-described laminate can then be used to form an electrolessly plated printed circuit comprising the sequential steps of (1) applying to the electrolessly plated layer a solid layer of photoresist;

(2) imagewise exposing the photoresist to actinic radiation to effect a solubility change in the light exposed image areas of the photoresist;

(3) removing the soluble image areas of the photoresist by solvent development, thus exposing the underlying electrolessly plated layer;

(4) etching away the exposed image areas of the electrolessly plated layer; and (5) stripping off the remaining areas of the photoresist.

DETAILED DESCRIPTION OF THE INVENTION

Figure 1:
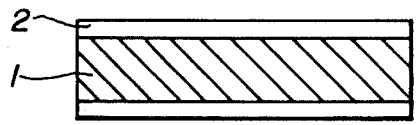
FIG. 1 shows a cross-sectional view of an electrically insulative substrate 1 bearing on both faces an adherent layer of polymeric hardenable adhesive 2.

Referring to FIG. 1, the dielectric substrate 1 can be any one of the various kinds of synthetic resin sheets, plates, laminates, or composites, etc., having the necessary electrical and mechanical properties, chemical resistance, heat resistance, etc. The substrate may be rigid, flexible or moldable. Examples of resins include: phenol-formaldehyde, epoxy and melamine resins, high performance resins such as aramids or other polyimides, fluorinated polymers, polysulfones, polyetherimides, polyesters, polyether-ketones, etc. Glass plates and ceramic or ceramic coated metal plates are also useful. The substrate can also be paper, cardboard, fiber, including glass cloth, aramid fibers, wooden sheet material or paper-base phenolic resin laminate. Paper base without resin is particularly useful in producing low cost printed circuits. Metal sheets can be used provided that the material adhered thereto acts as an insulating barrier between the metal sheet support and the built up metallized circuit. Also useful are self-supported photohardenable elements as disclosed in Peiffer, U.S. Pat. No. 4,054,479.

Before applying the curable adhesive, any required through holes in the substrate may be made and the substrate is suitably cleaned, surface roughened if necessary, rinsed and dried. Roughening creates bonding sites for the adhesive and can be achieved by mechanical abrasion with stiff brushes, abrasive pads, etc., or by other physical means such as sand or vapor blasting. Chemical methods for roughening the surface or providing bonding sites may also be used, such as chemical etching or application of adhesion promoters such as silanes.

The hardenable adhesive 2 in FIG. 1 contains as binder a polymer for example a copolymer of butadiene, acrylonitrile and methacrylic acid. Other examples are epoxy resins, acrylic copolymers such as from acrylonitrile, butyl acrylate and methacrylic acid monomers. The binder composition is chosen in part for good adhesion to the particular substrate in use and consequently may vary depending on the substrate. The remaining components of the adhesive composition depend on whether hardening (curing) of the adhesive is to be achieved by photopolymerization, or by thermally initiated polymerization or by crosslinking with thermosetting materials or by vulcanization-type processes or some combination of these.

Photopolymerizable adhesive compositions contain the usual ingredients of a photopolymerizable composition, i.e., ethylenically unsaturated compound and photoinitiator or photoinitiator system in addition to the polymeric binder. Other materials can also be present such as oligomers, plasticizers, fillers, colorants, ultraviolet absorbers or optical brighteners. Suitable monomers are those disclosed in Fickes and Rakoczy, U.S. Pat. No. 4,400,460, column 3, line 48 to column 5, line 4, and Haney and Lott, U.S. Pat. No. 4,411,980, column 4, lines 10 to 65. The photoinitiator or photoinitiator system includes any of those compounds disclosed in Notley, U.S. Pat. No. 2,951,752, Chambers, U.S. Pat. No. 3,479,185, Chang and Fan, U.S. Pat. No. 3,549,367, Fan, U.S. Pat. No. 3,558,322, Cescon, U.S. Pat. No. 3,615,454, Grubb, U.S. Pat. No. 3,647,467, Baum and Henry. U.S. Pat. No. 3,652,275, Chang, U.S. Pat. No. 3,661,558, Strilko, U.S. Pat. No. 3,697,280, Chang, U.S. Pat. No. 3,926,643, Dessauer, U.S. Pat. No. 4,311,783, Sysak, U.S. Pat. No. 4,341,860, etc.

Thermally curable compositions can be made by substituting a thermal initiator such as an organic peroxide, an azo compound or other known thermal polymerization initiators for the photoinitiator, or by mixing, with the binder, thermosetting resin systems such as epoxy, phenol-formaldehyde, melamine-formaldehyde, etc., polyamic acid compositions which thermally form polyimide resins such as those described in Fryd, U.S. Pat. No. 4,588,804 or by use of Vulcanizable compositions.

The adhesive can be applied as a liquid, e.g., solution, suspension, etc., by conventional means, such as dip coating, spin coating, coating with a doctor knife, spraying, brushing, etc. The layer may be 0.00001 inch to 0.006 inch (0.254 to 152.4 microns) thick, preferably 0.00005 to 0.003 inch (1.27 to 76.2 microns) thick. When vias are present, coating their walls with adhesive is optional. If walls are to be covered, the adhesive layer is preferably coated thinly to cover the via sidewalls without plugging holes. For thicknesses from 0.001 inch to 0.002 inch (25.4 to 50.8 microns), the adhesive is preferably applied in the form of a dry layer using lamination procedures well known in the art.

Radiation sources for photocuring are known to those skilled in the art. These are rich in ultraviolet radiation. Suitable sources are disclosed in Plambeck, U.S. Pat. No. 2,760,863, Chu and Cohen, U.S. Pat. No. 3,649,268, Peiffer, U.S. Pat. No. 4,157,407 and Haney and Lott, U.S. Pat. No. 4,411,980. Other actinic radiation sources include an Argus Model PC-7100 ultraviolet processor or a Tamarack ®152R, a 1000 watt collimated mercury arc.

Thermal curing of the adhesive layer can be achieved by heating in a temperature controlled oven or by infrared radiation.

Figure 2:
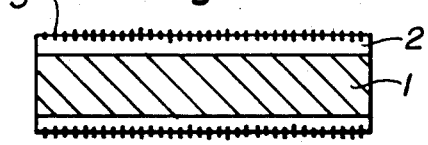
FIG. 2 shows a cross-sectional view of finely divided microporous particles of a receptor material 3 partially embedded in the adhesive layer 2 and partially protruding from the adhesive surface away from the substrate 1.
Figure 3:
FIG. 3 is an enlarged partial cross-sectional view of FIG. 2 showing a microporous receptor particle 3 partially embedded in and protruding from the surface of the adhesive 2.

Referring to FIGS. 2 and 3, the microporous receptor particles 3 applied to the adhesive layer are finely divided, high porosity substances having a high surface area. They can be mineral particles such as gamma-aluminum oxide, Boehmite alumina, silica, and magnesium oxide.

As with all catalyst supports it is essential that the adsorbent surface of the catalytic receptors allows access of the catalytic material and that it is both chemically and physically stable under the conditions of use. So long as the catalyst receptors meet these basic criteria the exact chemical composition is not so important in its use for the invention so long as it does not interfere with the catalytic function. Therefore solid particles which may be either inorganic or organic in nature are useful which have a surface area of at least 75 $m^2/g$ and a pore volume of at least 0.1 $cm^3/gm$. A surface area of at least 200 $m^2/g$ and pore volume of at least 0.5 $cm^3/gm$ are preferred.

In view of the inverse relationship between surface area and pore diameter of such adsorbents it is preferred that the surface area of the receptors be no more than 500 $m^2/g$ and preferably no more than 400 $m^2/g$. Finely divided particles of Boehmite alumina are particularly preferred for use as catalyst adsorbent in the invention. Receptor particle size can be 0.5 to 50 microns, preferably 1 to 10 microns. Surface area can be 150 $m^2/g$ or higher, preferably above 250 $m^2/g$.

The finely divided receptor particles are applied to the uncured adhesive layer in such manner that they become only partially embedded therein. It is important that the receptor particles protrude from the adhesive surface away from the substrate so the protruding uncovered portions provide the sites for receiving deposits of metal or reductant which catalyze or initiate electroless plating.

The adsorbent particles may be applied by known methods including but not limited to the toning methods described in Burg and Cohen, U.S. Pat. No. 3,060,024, Chu and Cohen, U.S. Pat. No. 3,649 268, and Tobias, U.S. Pat. No. 4,069,791. It is also possible to use a fluidized bed of particles as described in Research Disclosure, June 1977. No. 15882 by peiffer and Woodruff. Not only must the receptors be adsorptive with respect to the electroless plating catalysts or their reductive precursors, but it is preferred that they also be nonadsorptive with respect to materials contained in any overlying photodielectric layers. As used herein, the term "toning" refers to applying adsorbent receptor particles to the adhesive layer so they become only partially embedded and protrude from the surface away from the substrate. Optionally, the acceptance of the particles by the surface may be improved by tackifying the adhesive, e.g., by heat from an infrared heater or by treatment with a plasticizing solvent. This may be accomplished during the application of the particles. Removal of excess receptor particles from nonadherent areas, if necessary, is described in the above-identified U.S. patents and the Research Disclosure.

After toning, the adhesive layer is hardened. This can be done thermally, photochemically or a combination of the two. In the embedded portion of the particle, adhesive can enter the pores; hardening the adhesive thus serves to lock the particle in the layer as well as increasing the layer's cohesive strength. Both factors enhance bonding of the subsequently plated metal.

Figure 4:
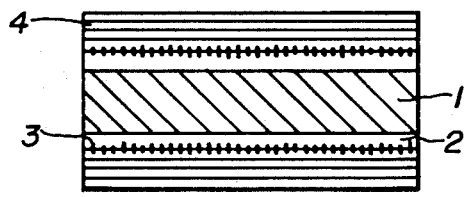
FIG. 4 is a cross-sectional view of photodielectric 4 overlying the adhesive layers 2 and receptor particles 3.

As shown in FIG. 4, the photodielectric 4 is applied to the toned surfaces. Liquid application by conventional means can be used, e.g., solution, suspension, etc., by dip coating, spin coating, coating with a doctor knife, spraying, etc. The photodielectric layer may be 0.0001 inch to 0.004 inch (25.4 to 101.6 microns) thick, preferably 0.001 to 0.002 inch (25.4 to 50.8 microns) thick. For thicknesses in the 0.001 to 0.004 inch (25.4 to 101.6 microns) range, the photodielectric is preferably applied in the form of a dry layer using lamination procedures well known in the art.

Optionally and preferably the photodielectric is protected by a flexible and strippable cover sheet overlying the photodielectric layer. Such cover sheets are disclosed in Celeste, U.S. Pat. Nos. 3,526,504 and 3,469,982.

The preferred photodielectric compositions described in detail below in the specification are photopolymerizable compositions, i.e., compositions which harden in the exposed image areas. The invention, however, is not limited to the use of photopolymerizable dielectrics. The dielectric can be prepared from other photosensitive compositions, e.g., photocrosslinkable, photosolubilizable, photodesensitizable compositions, or combinations thereof, which are either positive-working or negative-working. These systems are disclosed generally in Kosar, Light Sensitive Systems, Chapters 4 to 6. Wiley and Sons, New York, 1965. Other useful photosensitive compositions can be exemplified as follows: photocrosslinkable compositions of Celeste, U.S. Pat. No. 3,526,504, photosolubilizable compositions of Roos, U.S. Pat. Nos. 3,778,270 and 3,837,860, and photodesensitizable compositions of Nebe, U.S. Pat. No. 4,029,505 and Pazos, U.S. Pat. No. 4,198,242. Photopolymerizable dielectrics contain the normal ingredients of photopolymerizable materials, i.e., polymeric binder or mixture of polymers as binder, ethylenically unsaturated compound and photoinitiator or photoinitiator system. Other materials can also be present such as oligomers, plasticizers, fillers, colorants, ultraviolet absorbers, optical brighteners, etc. Suitable examples of useful monomers and photoinitiator systems are those described above for photopolymerizable adhesive layer compositions.

preferred compositions are those wherein the exposed and developed dielectric has good adhesion, flexibility, electrical insulating properties and good resistance to heat, moisture, solvents, electroless plating baths and printed circuit soldering operations. In large part, these properties are attributable to the binder. Suitable binders include, but are not limited to, those described in Gervay and Pilette, U.S. Pat. No. 4,278,752 column 5 lines 4 through 40.

The imaged photodielectric 5 is produced by exposure to actinic radiation through a mask of the desired circuit pattern. The sources providing actinic radiation for imagewise exposure are known to those skilled in the art and are rich in ultraviolet radiation. Suitable sources are listed above in the section describing exposure of the hardenable adhesive layer.

The resulting element is optionally nonimagewise exposed to infrared radiation before development. This heating step enhances the degree of polymerization of negative working systems, improves contrast and resolution, allows shorter image exposure time and produces straighter sidewalls.

Figure 5:
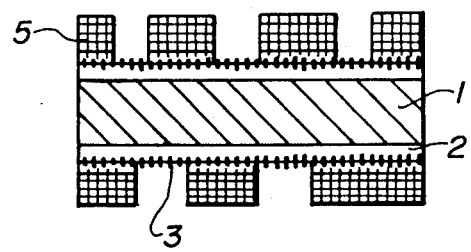
FIG. 5 is a cross-sectional view of hardened photodielectric 5 exposed and developed to make circuit patterns of uncovered receptor particles 3.

The more soluble portions of photodielectric are removed by solvent washout (FIG. 5). The receptor particles 3 remain in the developed-out areas and retain open micropores as shown in FIG. 3. Typical development solvents include: 1,1,1-trichloroethane, perchloroethylene, perchloroethylene and n-butanol, 1,1,1-trichloroethane and n-butanol, butyl and ethyl Cellosolve®, butyl Carbitol® and 1,1,1-trichloroethane and derivatives thereof, various alcohols, e.g., methanol, ethanol, propanol, isopropanol, etc. and 1,1,1-trichloroethane, etc. These and other useful solvents. e.g., aqueous and semi-aqueous developers are described in the patents which disclose the particular photosensitive compositions.

The resulting element is prepared for electroless plating by known methods. This may be by a one-step or a two-step process. In the preferred two-step method, the element is first treated with a sensitizer, or catalyst precursor, which is a reducing agent. Stannous chloride is the preferred sensitizer, but others known in the art would be suitable, such as cuprous chloride, as in Steffen, U.S. Pat. No. 4,020,197, and trivalent arsenic compounds as in Bernhart. U.S. Pat. No. 3,764,488. In addition to the inorganic agents described, organic reducing agents such as hydrazine can be used.

In the second step of this process, a metal catalytic for electroless plating, such as palladium, platinum, gold, silver or copper is deposited on the receptor particles. The sensitized element is treated with a solution of a salt of one of these metals and the salt is reduced by the stannous chloride or other sensitizer to deposit metal in the micropores. Palladium chloride is a preferred salt, but other solutions can be used, such as a palladium or platinum chloride/hydrochloric acid bath, an ammoniacal silver nitrate bath, or a copper halide solution as in Nuzzi et al., U.S. Pat. No. 4,450,190.

Figure 6:
FIG. 6 is an enlarged cross-sectional view of a microporous particle 3 having catalyst particles 6 adsorbed in the micropores away from the adhesive surface 2.

It is desirable to rinse thoroughly after both sensitizing and catalyzing. Good rinsing removes excess sensitizer and catalyst from the adjacent photodielectric and from the particle surface between pores. The desired reductant is thereby preferentially localized inside the micropores (FIG. 6). Extraneous plating is thus minimized and adhesion of electrolessly plated metal is maximized by the interlocking of the metal with the receptor particles.

In a one-step process, a suspension of colloidal metal particles, such as copper or palladium having a protective colloid of stannic tin, is used directly after photodielectric washout to catalyze the receptor particles. Useful compositions are commercially available. e.g., from Shipley Co. or Lea Ronal.

The catalyzed element is electrolessly plated by methods well known in the art. The plated metal 7 in FIGS. 7 and 8 may be copper, nickel, gold, silver, cobalt, or any metal known in the art to be capable of electroless deposition. Copper is preferred. Electroless plating baths and procedures are known to those skilled in the art, e.g., U.S. Pat. No. 4,054,483. Electroless plating baths are commercially available, e.g., from Shipley Co., Revere, MA, Kollmorgen Corp., Glen Cove, NY, Lea Ronal, Freeport, NY and other sources. Useful electroless plating solutions are described in Zeblisky et al., U.S. Pat. No. 3,095,309, particularly Example II. The catalyzed element to be plated is maintained in the bath under conditions described below whereby the uncovered areas of the catalyzed, partially embedded receptor particles forming the circuit image are plated over to form an electrically conductive circuit.

It is preferred to carry out the electroless plating in two stages, wherein the first stage uses an active bath for a short time, followed by a longer plating time in a more stable, less active bath. The initial flash plating or priming is carried out long enough to plate a thickness of 0.5 micron to 1.0 micron to assure complete coverage of deposited metal in all circuit areas, including vias. The element being plated can be removed from the bath for visual inspection and replaced to continue plating if necessary. The first bath has higher activity, which may be achieved by operating at temperatures of 5° to 15° F. above the usual bath operating temperature. Other ways of increasing plating activity are by reducing the concentration of the stabilizer or complexing agent in the bath. For a commercial copper plating composition that typically operates at 127° F. the operating conditions for the priming bath would be at 132° to 142° F. for a time of 2 to 15 min.

The second stage in plating uses a bath for a longer time, as long as needed to get the plating thickness required. The second bath has lower activity, thus is more stable and is less subject to nodules, extraneous copper deposition and other plating defects. Lower activity can be achieved by operating at temperatures of 5° to 15° F. below the normal bath operating temperature. Other ways of decreasing bath activity are by increasing stabilizer or complexing agent concentration. For a commercial copper electroless plating bath that typically operates at 127° F. the operating conditions in the second bath would be 118° to 122° F. for 4 to 16 hrs. to achieve a final plating thickness of 0.0005 inch to 0.002 inch (12.7 microns to 50.8 microns).

Figure 8:
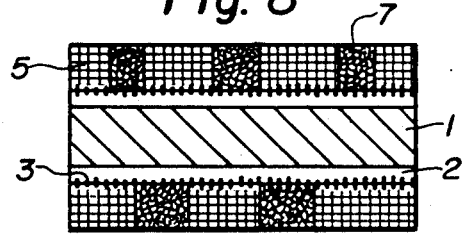
FIG. 8 shows plated metal 7 filling the entire circuit pattern channel defined by exposed and developed photodielectric 5. The plated metal is tightly adhered to the adhesive layer 2 by means of the embedded microporous particles 3.

Referring to FIG. 8, the metal deposit 8 may be plated up to the full height of the photodielectric 5 electrolessly or electrolytically, with the same or different metal or alloy used in the initial bath. When plating has reached the top of the sidewalls as shown in FIG. 8 plating is stopped. The element is rinsed and may be treated with benzotriazole solution to prevent copper oxidation on further storage and handling.

In another embodiment, known in the art as semiadditive plating, an adhesive coated substrate can be toned, catalyzed, nonimagewise flash plated over its entire surface, imaged using known resist procedures and then pattern electroplated. To form a final circuit, the resist is then stripped and the element flash etched to remove the thin electroless metal from areas originally beneath the resist image.

A final oven baking step removes residual volatile materials and anneals plated copper, improving its physical properties. Optimum baking conditions depend on adhesive composition and the degree to which the element was cured before plating.

In another embodiment of the invention, it is possible to prepare a circuit without using a photodielectric layer to define the circuit pattern. This would be useful for lower density circuit board applications.

Referring to FIG. 1, the dielectric substrate 1 can be any of the various types previously mentioned. Any required through holes can be made and the substrate cleaned and surface roughened if necessary. The adhesive 2 must be photohardenable. The adhesive compositions, thicknesses and application methods previously outlined are suitable.

Figure 9:
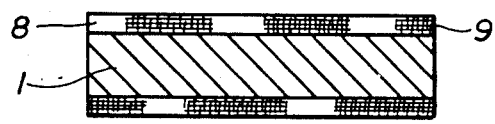
FIG. 9 shows a cross-sectional view of an electrically insulative substrate 1 bearing on both faces, in a circuit image pattern, areas of unexposed photohardenable adhesive 8 and areas of exposed and photohardened adhesive 9.

Corresponding to FIG. 9, the element is exposed to a positive circuit transparency, in registration with any through holes as required, to leave an image of circuit lines and pad areas consisting of unexposed adhesive 8.

Figure 10:
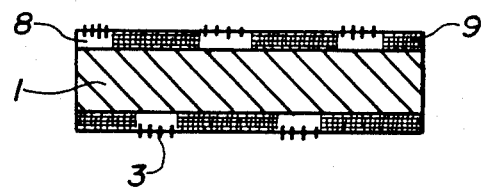
FIG. 10 is a cross-sectional view showing finely divided microporous particles 3 partially embedded in the unexposed portions 8 of the photohardenable adhesive layer and no particles in adjacent exposed, hardened areas 9. The receptor particles partially protrude from the adhesive surface away from the substrate.

Corresponding to FIG. 10, the resulting element is next toned to partially embed microporous receptor particles 3, in the unexposed portions 8 leaving no particles in the exposed, photohardened areas 9. Any of the materials and methods previously described are suitable for this step.

The receptor particles are sensitized and/or catalyzed then electrolessly plated by previous methods and the circuit produced is baked. Corresponding to FIG. 11, the metal layer is adherently bound to the element by means of the receptor particles 3. The sidewalls are not as straight and circuit definition and conductor thickness are limited due to the absence of a photodielectric layer to define circuit lines.

In a still further embodiment of the invention, it is possible to prepare a uniformly plated substrate which can be converted to an electrical circuit by conventional print and etch or print, plate and etch methods.

Referring to FIG. 2, this process starts with an element having finely divided microporous receptor particles 3 partially embedded in and partially protruding from an adhesive layer 2. The substrate, adhesive layer, and receptor particles can be any of the materials previously disclosed as suitable for this invention. The adhesive layer can be applied from solution or suspension or as a dry film, the receptor particles are toned by any of the methods previously outlined.

Figure 7:
FIG. 7 shows an enlarged cross-sectional view of a particle 3 having metal 7 catalytically plated out to fill surface micropores, bridge the particle surface between pores and begin to plate onto the adhesive layer 2.

The receptor particles are next sensitized and/or catalyzed and electrolessly plated by any of the methods already specified. The conductive metal 7, as shown in FIG. 7, may be plated to any necessary thickness to yield a uniform layer over the entire substrate, firmly anchored by means of the receptor particles.

Circuit formation proceeds using conventional resist techniques, either screen printing or photoprinting with a liquid or dry film photoresist, either positive or negative working. Once the resist image is established, in registration with any through holes as required, the circuit is formed by standard etch or plate and etch methods. The results correspond to those achieved starting from copper clad laminate.

EXAMPLES

In the following examples which illustrate the invention the proportions are by weight unless otherwise indicated. Examples 1, 2, and 3 employ a photodielectric to define the circuit channels for plating. When photoimaging is used for making two-sided circuit boards in this invention, the substrate and/or the adhesive must be light absorbing to prevent print-through and halation from degrading image quality during the imaging step.

EXAMPLE 1

This example used a light transmitting substrate with a light absorbing photocurable adhesive.

A. Preparation of Substrate—The substrate was a 0.01 inch (0.254 mm) FR-4 noncopper-clad glass-epoxy panel. It was cleaned and roughened on both sides by means of a Somaca ® scrubber model SBC-12F, Which conveyed the panels between scrubbing brushes, spray rinses and air blast drying sections. (Somaca ® is a registered trademark of Somner and Maca, Chicago, IL for circuit board scrubbers.)

The cleaned substrate was air dried at room temperature, rinsed with methyl chloroform solvent and further air dried. All remaining volatiles were removed by a five minute bake in a 150° C. oven.

B. Applying Curable Adhesive Composition—The adhesive coating solution had the following composition. The materials were added in the order indicated:

| Ingredient | Amount (Parts) |
| --- | --- |
| Di-(3-acryloxy-2-hydroxypropyl) ether of bisphenol-A[1] | 32.0 |
| Methylene chloride | 1000.0 |
| Hexamethylene glycol diacrylate | 16.6 |
| Trimethylopropane triacrylate | 16.6 |
| Methylene chloride | 3500.0 |
| Methanol | 98.0 |
| Michler's ketone | 8.0 |
| 2,2'-Dimethoxy-2-phenylacetophenone[2] | 10.0 |
| C.I. Solvent Red 109 dye | 16.0 |
| Synthetic rubber [3% carboxy-modified acrylonitrile(27)/butadiene(73) copolymer] average Mooney viscosity 45[3] | 100.8 |
| Methylene chloride to make | 5000.0 |

[1]Celrad ® 3700, Celanese Chemical Co., Dallas, TX
[2]Irgacure ® 651, Ciba-Geigy Corp., Ardsley, NY
[3]Hycar ® 1472X26, B. F. Goodrich Akron, OH The glass-epoxy substrate was coated with adhesive by inserting the panel vertically at room temperature into the solution, holding for 10 seconds, withdrawing rapidly, and air drying 30 minutes. Remaining volatiles were removed by drying 5 minutes in a 100° C. oven. The resulting adhesive layers each have a coating weight of 30–35 mg/dm$^2$ corresponding to a thickness of about 0.0001 inch (2.54 microns).

C. Applying Microporous Receptor Particles—The adhesive coated panels were laid on silicone resin treated polyester sheets to prevent the tacky adhesive from sticking. Powdered activated Boehmite alumina (Monal ® 300, Aluminum Co. of America, pittsburgh, PA, median of 8.7 microns, surface area of 300 m$^2$/g.)

The particles were applied by lightly swabbing, or toning, the adhesive surface with a mohair pad previously loaded with particles by dipping the pad into a supply of toner. The toning was carried out in vertical parallel strokes across the entire panel, then is followed by complete coverage with parallel horizontal strokes (one toning cycle). Four toning cycles completed the application procedure. Both sides were toned.

The toned panel was let stand 5 minutes at room temperature then wiped with a lint free, oil treated flannel cloth, (LAS-STIK ® cloth, LAS-STIK Manufacturing Co., Hamilton, OH). This removed excess loose alumina particles. The toning and cleaning procedure was then repeated on the other side of the panel.

D. Adhesive Laver Curing—The toned element was ultraviolet radiation cured by passing through a Model PC-7100 ultraviolet processor (Argus International, Hopewell, NJ) at a transport speed of 40 ft/min (20.3 cm/sec). To prevent sticking, silicone resin treated film was placed over the rigid carrier used convey the panel beneath the radiation source. Both panel sides were cured.

E. Applying photodielectric—A dry film resist was prepared by machine coating the composition below onto 0.0005 inch (12.7 microns) polyethylene terephthalate film; 0.001 inch (25.4 microns) polyethylene was used as a temporary interleaf. The resist film was applied to both sides of the cured element with a Riston ® HRL-24 hot roll laminator (E. I. du Pont de Nemours and Company, Wilmington, DE), operating at 103° C.

| Ingredient | Amount (Parts) |
| --- | --- |
| Di-(3-acryloxy-2-hydroxypropyl) ether of bisphenol-A | 240.0 |
| Trimethylolpropane triacrylate | 240.0 |
| Methylene chloride | 3000.0 |
| o-Chloro HABI | 30.0 |
| Michler's ketone | 1.0 |
| TLA-454 | 3.2 |
| Cyan pigmented polymer[1] | 3.0 |
| Yellow pigmented polymer[2] | 3.0 |
| High molecular weight poly-(methyl methacrylate)[3] | 200.0 |
| Copolymer binder[4] | 282.2 |

[1]Monastral ® Blue G (BT 284D), CI No. Pigment Blue 15 (40%) dispersed in Elvacite ® 2051 (50%) with 10% Elveron ® AB Dispersent (E. I. du Pont de Nemours and Company, Wilmington, DE).
[2]Chromophthal ® Yellow 3G, CI No. Pigment Yellow 93 (40%), dispersed in Elvacite ® 2051 (50%), with Elveron ® AB Dispersant (10%).
[3]Elvacite ® 2051 (E. I. du Pont de Nemours and Company, Wilmington, DE).
[4]Acryloid ® BTA-III-S (Rohm and Haas Co., Philadelphia, PA.)

F. Photodielectric Exposure and Development—The laminated element was exposed 10 seconds through fine line positive artwork in a 5 kW mercury vapor Riston ® PC-24 Printer (E. I. du Pont de Nemours and Company, Wilmington, DE).

After exposure, in order to enhance image quality, each side of the panel was heated by being conveyed beneath two infrared lamps. Conveyor speed was 1.2 feet/minute, lamp to panel distance was one inch. Surface temperature of the panels reaches 110° C. as measured by Tempilabels ® (Tempilabels ® is a registered trademark of Tempil Div. of Big Three Industries, Inc., South Plainfield, NJ for temperature measurement materials.). During this treatment, the polyester cover sheet on the laminated film was left in place.

After cover sheet removal, the circuit image was developed with methyl chloroform in a Riston ® C-processor, (E. I. du Pont de Nemours and Company, Wilmington. DE). Conveyor speed was adjusted so residence time in the solvent chambers totaled 24 seconds. Unexposed photodielectric is removed and the receptor particles were revealed in the open areas. Resolution was 0.001 to 0.002 inch (25.4 to 50.8 microns) lines and spaces for a 0.001 inch (25.4 microns) film.

G. Treatment with Catalyst Precursor—The developed panel was cleaned by swabbing with mild detergent solution, rinsing in tap water, followed by distilled water. The panel was then immersed two minutes in 0.6% SnCl₂ solution at room temperature. This solution was prepared by dissolving 36 g of SnCl₂ in 36 g of concentrated HCl then diluting to 6000 g with distilled water. After treatment, the sample was rinsed in tap water one minute, then distilled water for 30 seconds. To remove extraneous and loosely held stannous chloride, the panels were twice dipped in 1N HCl for 30 seconds. Stannous chloride residues were thus preferentially left inside the micropores of the partially embedded receptor particles.

H. Formation of Catalytic Sites—The panel was next treated for two minutes in acidic 0.025% PdCl₂ solution prepared by diluting acidic 5% PdCl₂ 200-fold with distilled water. The catalyzed panel was rinsed in tap water one minute and distilled water one minute. Palladium chloride was thereby reduced to metallic palladium in areas where stannous chloride was present, preferentially inside receptor micropores.

I. Electroless Plating—Two step electroless plating, in which an active bath was used for a short time to produce a thin flash plating or priming layer of copper, followed by longer immersion in a lower activity bath, was preferred. This further enhances plating selectivity, leading to improved quality.

As a priming bath, commercial composition AP 480 (Kollmorgen Corp., PCK Technology Div., Melville, NY) was used. This was a high pH, complexed copper salt, formaldehyde reductant composition. Operational temperature was 57° C. ($+/-1°$ C.) with an immersion time of 3-10 minutes, selected so that uniform plating was visible in all recessed circuit areas. The plated panel was rinsed in tap water one minute and in distilled water 30 seconds.

To complete plating, the flash plated article was held in a bath of identical composition, but for about eight hours or as needed to achieve 0.001 inch (25.4 microns) copper in circuit areas. Bath activity was reduced by operating at temperature of 48° C. ($+/-1°$ C.). Plating quality was thereby improved and better controlled. After rinsing, as above, the part was treated with aqueous acidic benzotriazole solution to prevent copper oxidation during further storage and handling. Plated resolution was 0.001 to 0.002 inch (25.4 to 50.8 microns) lines and spaces for 0.001 inch (25.4 microns) plating and photodielectric film thickness.

Resolution was a measure of the quality of the resultant plating and thus effectiveness of the adsorbed catalyst or reductant system. Good resolution was not achieved unless there was no extraneous plating, e.g., no mushrooming of copper onto the photodielectric surface, no plating nodules along circuit lines nor any rims of plated metal around via holes.

A final treatment of the plated panel in a 150° C. oven for one hour removed residual volatiles and improved adhesion of the plated copper to the adhesive layer. Alternatively, the part may be heated in a platen press at 350° F. under a pressure of 50–400 psi (3.4–27.2 atmospheres) for one hour. Without this heat treatment peel testing of the bond between the copper and the adhesive layer shows a break between the two materials. After heat treatment, the failure locus shifts to become a cohesive break within the adhesive layer.

EXAMPLE 2

This example uses a light absorbing substrate and a light transmitting thermally curable adhesive.

A. Preparation of Substrate—The substrate material was 0.015 inch (0.38 mm) black FR-4 unclad glass-epoxy. It was prepared for use as described in Example 1A.

B. Applying Curable Adhesive Composition—The adhesive used was a 44% solids aqueous dispersion of an acrylic copolymer (acrylonitrile 35/butyl acrylate 60/methacrylic acid 5) plus a phenol formaldehyde resin (Grade BRL 100, Union Carbide, CT).

Coating and drying were carried out as in Example 1B; a dry layer thickness of about 0.0003 inch (7.5 microns) on each side was achieved. The coating was not tacky at room temperature.

C. Applying Microporous Receptor Particles—Hot toning was required for this adhesive composition.

The smooth flat surface of a hot plate was brought to 138°-155° C. (280°-310° F.). Activated alumina, Monal ® 300 as in Example 1C, was spread uniformly on the hot surface. The adhesive coated element was placed on the hot powder layer for 10 seconds, turned over, then toned with a mohair pad carrying more alumina particles, as in Example 1C, for 10 seconds. The toning operation was then repeated on the other side. Hot toning as above was repeated four times for each side. The toned panel was allowed to cool to room temperature and excess particles were wiped off with a treated cloth as in Example 1C.

D. Adhesive Layer Curing—The adhesive layers were cured by holding the toned panel in a 150° C. (302° F.) oven for one hour.

Preparation of Electrolessly Plated Circuit

The process of applying exposing and developing a photodielectric, followed by formation of catalytic sites and electroless plating, was repeated as described in Example 1 (E through I). The same high resolution and good adhesion as in Example 1 were obtained.

EXAMPLE 3

This example used a light absorbing substrate and a light transmitting photosensitive adhesive layer.

A. Preparation of Substrate—The substrate and preparation for coating were the same as described in Example 2A.

B. Applying Curable Adhesive Composition—The adhesive coating solution had the following composition. The ingredients were combined to give a 4% solids solution in a mixture of 92% methylene chloride and 8% methanol.

| Ingredient | Amount (Parts) |
| --- | --- |
| Hexamethylene glycol diacrylate | 52.0 |
| Trimethlolpropane triacrylate | 52.0 |
| 2.2'-Dimethoxy-2-Phenylaceto-phenone[1] | 30.0 |
| C.I. Solvent Red 109 dye | 1.0 |
| Synthetic rubber [3 carboxy-modified acrylonitrile(27)/buta-diene(73) copolymer ]average Mooney viscosity 45 | 364.5 |

[1]Irgacure ® 651 (Ciba-Geigy Corp., Ardsley. NY).

Receptor particles were applied and the adhesive layers cured as in Examples 1(C and D). A dry film photodielectric the same as Example 1E except for a 0.001 inch (25.4 microns) cover sheet, methylene chloride 1857 parts, benzophenone 50 parts replacing o-Chloro HABI, Michler's ketone 1.5 parts, Crystal Violet dye 0.15 parts replacing TLA-454, poly(methyl methacrylate) 20 parts and copolymer binder 262.4 parts was applied at 0.0015 inch (38.1 microns) thickness, exposed and developed as in Example 1(E and F). Treatment of the microporous receptor particles, catalyzing and electroless plating were carried out as in Example 1(G, H and I). As in Example 1, a circuit of high resolution and good adhesion was obtained.

EXAMPLES 4A-4H

These examples illustrate means to catalyze receptor particles by a one-step process. No photodielectric imaging was used, therefore the entire panel surface was plated to make elements suitable for subsequent circuit formation by etching or plating by conventional means. Details are given in the following descriptions and table.

The substrate was glass-epoxy. It was cleaned, roughened and dried as in Example 1.

The adhesive compositions, methods of application and curing were the same as described in Example 2 or Example 2I, as was the method of applying the microporous receptor particles which in these Examples were all various forms of alumina.

In Examples 4A–4D, catalytic sites were formed by using Cataposit ® 44 (Shipley Co., Newton, MA), a colloidal dispersion of 50–100 angstrom unit size particles composed of a shell of stannic chloride surrounding a core of palladium. This composition was widely used in the art as a catalyst system for electroless plating. It was applied to the panels by immersing them two minutes at room temperature in a solution of Cataposit ® 44 diluted 2/1 with distilled water, followed by rinsing as in Example 1.

Examples 4E–4H were sensitized for electroless plating with the two-step procedure described in Example 1G and H except that a 3% $SnCl_2$/3% HCl solution was used and immersion time was extended to ten minutes in both baths.

The electroless plating procedure of Example 1 was used throughout.

plating results were ranked numerically after visual inspection using the following criteria

```
5 = Blister free (best)
4 = Some blisters
3 = Unacceptable - blisters, skips,
      misses, etc.
2 = Little plating
1 = No Plating (worst)
```

| Receptor | Particle | Adhesive | Catalyst | Quality |
| --- | --- | --- | --- | --- |
| A | Monal ® 300 | Ex. 3 | Cataposit ® 44 | 5 |
| B | A - 16[1] | Ex. 3 | Cataposit ® 44 | 3 |
| C | I - 2529[2] | Ex. 3 | Cataposit ® 44 | 2 |
| D | E-38248-65C[3] | Ex. 3 | Cataposit ® 44 | 5 |
| E | Monal ® 300 | Ex. 2 | Ex. 1 | 5 |
| F | E-38248-65C | Ex. 2 | Ex. 1 | 5 |
| G | Monal ® 300 | Ex. 2 | Ex. 1 | 5 |
| H | Versal ® GH[4] | Ex. 2 | Ex. 1 | 4 |

[1]alpha-Aluminum oxide, 0.35 micron particle size.
[2]alpha-Aluminum oxide, 2-4 micron particle size.
[3]gamma-Aluminum oxide, (Catapal ® SB, Conoco. Wilmington DE). Calcined at 900 F, then classified to give particle size less than 5 microns.
[4]gamma-Aluminum oxide, surface area after calcining 150-290 m$^2$/g (Kaiser Chemicals, Baton Rouge, LA)

EXAMPLE 5A–5J

These examples use various forms of silica as receptor particles. All other materials and procedures were the same as used for Examples 4A–4H. Results and experimental details are given in the following table.

| Receptor | Particle | Adhesive | Catalyst | Quality |
| --- | --- | --- | --- | --- |
| A | Syloid ® 72[1] | Ex. 3 | Cataposit ® 44 | 5 |
| B | Syloid ® 161[2] | Ex. 3 | Cataposit ® 44 | 4 |
| C | Syloid ® 244[3] | Ex. 3 | Cataposit ® 44 | 5 |
| D | Syloid ® 308[4] | Ex. 3 | Cataposit ® 44 | 4 |
| E | Syloid ® 620[5] | Ex. 3 | Cataposit ® 44 | 5 |
| F | Celite ® D7-1[6] | Ex. 3 | Cataposit ® 44 | 2 |
| G | Celite ® 281[7] | Ex. 3 | Cataposit ® 44 | 2 |
| H | Aerosil ® 200[8] | Ex. 3 | Cataposit ® 44 | 2 |
| I | Syloid ® 72 | Ex. 3 | Ex. 4E | 5 |

| Receptor | Particle | Adhesive | Catalyst | Quality |
|----------|----------|----------|----------|---------|
| J | Syloid® 245 | Ex. 3 | Ex. 4E | 5 |

[1] Particle size 4 microns, surface area 330 m²/g (W. R. Grace & Co., Davison Chemical Div., Baltimore, MD).
[2] Particle size 7 microns, surface area 175 m²/g, surface treated (Davison Chemical)
[3] Particle size 4 microns, surface area 310 m²/g, (Davison Chemical)
[4] Particle size 7 microns, surface area 250 m²/g surface treated (Davison Chemical)
[5] Particle size 20 microns, surface area 320 m²/g, (Davison Chemical)
[6] Diatomaceous silica, 0.05% retained on 325 mesh screen, oil adsorption 150 lb/100 lb, "White Mist" Grade (Johns Manville, Denver, CO).
[7] Diatomaceous silica, 1.2% retained on 325 mesh screen, oil adsorption 145 lb/100 lb, 281 Grade (Johns Manville).
[8] Average primary particle size 12 nanometers, BET surface area 200+/−25 m²/g (Degussa Corp., Pigments Div., Teterboro, NJ).

EXAMPLES 6A–6G

These examples show magnesium oxide, magnesium silicate and aluminum silicate as receptor particles. All other materials and procedures were the same as used in Examples 4A–4H. Results and experimental details are given in the following table.

| Receptor | Particle | Adhesive | Catalyst | Quality |
|----------|----------|----------|----------|---------|
| A | Magnesia[1] | Ex. 3 | Cataposit® 44 | 5 |
| B | Magnesia[1] | Ex. 3 | Ex. 4E | 1 |
| C | Mag. Silicate[2] | Ex. 3 | Cataposit® 44 | 2 |
| D | Mag. Silicate[3] | Ex. 3 | Cataposit® 44 | 2 |
| E | Mag. Silicate[4] | Ex. 3 | Cataposit® 44 | 2 |
| F | Alum. Silicate[5] | Ex. 3 | Cataposit® 44 | 2 |
| G | Alum. Silicate[6] | Ex. 3 | Cataposit® 44 | 2 |

[1] Particle size 100% through 325 mesh screen (Cerac Inc., Milwaukee, WI).
[2] Lo Micron Talc (Whittaker, Clark and Daniels, Plainfield, NJ)
[3] Fisher Scientific Co. (Pittsburgh, PA)
[4] Grade 1726 (Whittaker, Clark and Daniels)
[5] Washed Kaolin clay ($Al_2O_3 \cdot SiO_2 \cdot 2H_2O$) Grade 90 (J. M. Huber Corp., Havre de Grace, MD).
[6] Huber Grade 900, acid washed version of Huber Grade 90.

EXAMPLES 7A–7C

These examples show organic receptor particles. All other materials and procedures were the same as used in Examples 4A–4H. Results and experimental details are given in the following table.

| Receptor | Particle | Adhesive | Catalyst | Quality |
|----------|----------|----------|----------|---------|
| A | Acrylic Beads[1] | Ex. 3 | Cataposit® 44 | 2 |
| B | Paraffin Wax Beads[2] | Ex. 3 | Cataposit® 44 | 1 |
| C | Activated Carbon[3] | Ex. 3 | Cataposit® 44 | 3 |

[1] Particle size 0.66 micron, crosslinked trimethylolpropane triacrylate beads, prepared as described in U.S. Pat. No. 4,414,278.
[2] Eftofine® FT 800F (high melting Fischer Tropsch hard paraffin wax, Dura Commodities Corp., Harrison, NY)
[3] Darco® G-60 (ICI Americas, Inc., Wilmington, DE).

EXAMPLES 8A and 8B

These examples use cuprous oxide and copper powder.

Both of these materials are known catalytic agents for electroless plating, thus no separate catalyzing steps were needed. All other materials and procedures are the same as used in Examples 4A–4H. Results and experimental details are given in the following table.

| Receptor | Particle | Adhesive | Catalyst | Plating Quality |
|----------|----------|----------|----------|-----------------|
| A | Cuprous Oxide[1] | Ex. 3 | None | 5 |
| B | Copper[2] | Ex. 3 | None | 5 |

[1] Fisher Scientific.
[2] Particle size 2.6 microns, 99.8% Pure (Cerac, Inc).

EXAMPLE 9

This example uses a ceramic substrate and an additive process to form a conductive circuit.

A. Preparation of Substrate—The substrate was 0.040 inch (1.02 mm) alumina of the standard type used in printed circuit preparation. It was cleaned on both sides by rinsing with acetone and dried by a 30 minute bake in a 150° C. oven.

After cooling to room temperature, the panel was dipped in a 1% aqueous solution of gamma-aminopropyltriethoxysilane (Prosil® 221 from PCR, Inc., Gainsville, FL). This solution, applied to enhance adhesion, must be between six hours and one week old when used. After removal, the panel was immediately blown dry with compressed air.

B. Applying Curable Adhesive Composition—The ceramic panel was coated with adhesive and dried as described in Example 2B; a coating thickness of about 0.0003 inch (7.6 microns) was achieved.

C. Applying Microporous Receptor particles and Photoimaging—The adhesive coated panels were toned with Monal® 300 aluminum oxide and cured at 150° C. as in Example 2(C and D). Imaging was carried out using the dry film photodielectric composition and the procedures of Example 1(E and F) except that exposure time was 11 seconds.

D. Formation of Catalytic Sites and Electroless Plating—Stannous chloride catalyst precursor was used as in Example 1G, except that in the excess $SnCl_2$ removal step, a single 60 second dip in 1N HCl was used. Formation of catalytic sites and electroless plating were carried out as in Example 1(H and I). Four hours plating time gave a copper thickness of 0.0005 inch (12.7 microns); 16 hours was needed for 0.002 inch (50.8 microns) thick copper. While plated line resolution was not as high as in Examples 1 or 2, because neither the substrate nor the adhesive layer were sufficiently light absorbing. The resistivity solderability and adhesion were good. Testing is described in Example 11.

EXAMPLE 10

This example illustrates subtractive imaging to form printed circuits on ceramic panels previously uniformly plated with copper by means of this invention.

A. Preparation of Substrate, Applying Adhesive and Microporous Receptor Particles—These operations and the materials used were the same as in Example 9(A, B and C) except that no photodielectric or imaging step was involved.

B. Formation of Catalytic Sites and Electroless Plating—Carried out as in Example 9D.

C. Applying and Imaging Photoresist—A 0.002 inch (50.8 microns) thick dry film photoresist (Riston® 1220, E. I. du Pont de Nemours and Company, Wilmington Del.), was laminated to the electrolessly plated element by the method described in Example 1E. Photoimaging was by the procedure given in Example 1F, except for using a 15 second exposure time, negative artwork and 28 second residence time in the solvent chamber during development.

D. Etching, Stripping and Thermal Curing—Copper in the open areas on the panel was stripped by etching in 5% ammonium persulfate at room temperature. Photohardened resist overlying the remaining copper was removed by immersing the panel in methylene chloride with stirring. After rinsing and air drying, the adhesion of the copper circuit to the alumina substrate was enhanced by curing at 150° C. for one hour.

Solderability and adhesion were good, as tabulated in Example 11.

EXAMPLE 11

This example describes resistivity, solderability and adhesion testing of circuits made by the procedures in Examples 9 and 10.

A. Resistivity Testing—Resistivity was measured with a Hewlett Packard 4328A millimeter (Hewlett Packard, Palo Alto, Calif.) using a four-point probe with the meter set on the one ohm range. The copper circuit lines tested were plated or etched in a continuous folded line or "meander" pattern and have a 200-square area.

The following table shows the bulk resistivity, resistivity per square, and resistivity per square per mil for the samples, all of which were prepared by the additive plating process of Example 9. The resistivity of bulk copper is 0.6 milliohm/square/mil; typical resistivity for screen printed copper circuits is 1.2 m-ohm/sq/mil.

| Sample | Measured Resistivity | Cu Plating Thickness | Resistivity per Square | Resistivity per sq/mil |
|---|---|---|---|---|
| 2 | 0.06 ohm | 0.002 inch | 0.3 m-ohm | 0.6 m-ohm |
| 7 | 0.06 | 0.002 | 0.3 | 0.6 |
| 10 | 0.24 | 0.0005 | 1.2 | 0.6 |

B. Solderability Testing—The solderability test consists of crimping three 0.030 inch (0.8 mm) diameter wires over one edge of the panels. The wires extend in parallel about 0.08 inch (2.03 mm) apart across the face of the panel, each wire also overlies three 0.08 inch (2.03 mm) square copper pads. These test parts were then dipped in Alpha 611 solder flux (Alpha Metals, Inc., Jersey City, NJ) preheated by holding them on the surface of hot (235° C.) 60/40 tin/lead solder for ten seconds, and then immersing the parts in the solder for eight seconds. After cooling, the parts were defluxed in a 50/50 mixture of methyl chloroform and ethanol.

Samples tested included those made by the procedures of both Example 9 and Example 10. All of the samples had very good solderability as judged by their uniformly solder covered appearance.

C. Adhesion Testing—Adhesion testing was done approximately 24 hours after soldering. The testing consisted of bending the wires at a 90 degree angle to the substrate and pulling them one at a time on an Instron test machine (Instron Tensile Tester, Instron Corp., Canton, Mass.) until they broke free from the three pads to which they were soldered. A chart recorded the force in Newtons required to pull off the wires. The break can occur for one of three reasons: the wire may be pulled out of the solder, the solder may be separated from the metal pad, or the metal pad may be pulled from the substrate. Acceptable adhesion was greater than 15 Newtons.

The following table shows the results of the adhesion testing.

| Samples | Prepn. | Cu Plating Thickness | No. Pads Pulled | Ave. Force (Newtons) | Standard Deviation |
|---|---|---|---|---|---|
| 1, 2, 7, 8 | Ex. 9 | 0.0020 in | 12 | 24.3 | 3.62 |
| 3, 4, 11, 12 | Ex. 10 | 0.0020 in | 12 | 20.0 | 4.01 |
| 9, 10 | Ex. 9 | 0.0005 in | 6 | 17.3 | 3.37 |
| 13, 14 | Ex. 10 | 0.0005 in | 6 | 20.4 | 2.70 |

EXAMPLE 12

This example shows how the extent of adhesive layer crosslinking affects adhesion of plated copper and also that the effects of crosslinking were produced in more than one stage in the process.

Sample Preparation—Three-inch by one-inch pieces of glass-epoxy substrate were coated with the acrylic adhesive and toned with Monal® 300 activated alumina as in Example 2. They were then catalyzed, primed and plated as in Example 9. Sixteen hours total plating gives a 0.002 inch (50.8 microns) layer of copper.

Adhesion Measurement—Peel strength was measured on the plated samples with a Chatillon Model Dpp-10 push-pull gauge (John Chatillon & Sons, Inc., New York, NY). All sides of the plated sample were first trimmed off to prevent any copper that may overlap panel edges from influencing peel force measurements. Copper from one side of the panel was lifted up using a knife point and attached to the push-pull gauge. The panel was then fastened to a horizontal surface with double-back pressure sensitive tape and the copper was pulled slowly and vertically with the gauge until adhesive failure occurred. The dial reading in pounds was divided by sample width in inches to arrive at peel force in pounds/inch.

Thermal Treatment Variations—Plated copper adhesion was influenced by the thermal treatment given the toned element before catalyzing and plating ("cure" in the table below) as well as after plating ("bake" below).

Results from the first two groups of samples in the table show that optimum "cure" (before plating) was one hour at 150° C.; the last group of samples shows that optimum "bake" (after plating) was also one hour at 150° C.

| Cure | | Bake | | |
|---|---|---|---|---|
| Time | Temp | Time | Temp | Peel Strength |
| 5 min | 150 C. | 1 hr | 150 C. | Low, blisters after two hours plating. |
| 15 min | " | " | " | Low, blisters after baking. |
| 30 min | " | " | " | 6.4 lb/in |
| 1 hr | " | " | " | 6.4 lb/in |
| 1 hr | 150 C. | 1 hr | 150 C. | 7.5 lb/in |
| " | 180 | " | " | 4.7 lb/in |
| " | 200 | " | " | 2.1 lb/in |
| 1 hr | 150 C. | No Bake | | 2.7 lb/in |
| 1 hr | 150 C. | 1 hr | 150 C. | 6.9 lb/in |
| 1 hr | 150 C. | 1 hr | 200 | Blisters after baking. |

EXAMPLE 13

This example illustrates the preparation of a double sided circuit with interconnected vias.

The substrate was 0.01 inch (0.254 mm) glass-epoxy, scrubbed as in Example 1A. A pattern of 1300 0.0135 inch (0.343 microns) diameter holes was drilled in the substrate using a drill press and a positive transparency as a drilling guide. The holes were blown free from drilling debris with compressed air then rinsed with methyl chloroform, etc., as in Example 1A.

The adhesive composition of Example 1B was applied as described. At this point, adhesive covered both surfaces of the panel and the inside of the holes without plugging. The panel was then toned on both surfaces and in the holes with Monal ® 300 alumina, cured, and laminated with photodielectric as in Example 1C through 1E. The photodielectric was exposed through positive artwork having 0.020 inch 0.508 mm) pads connected by lines 0.10 inch (2.54 mm) long and 0.012 inch (0.305 mm) wide. On one side of the panel, the lines were parallel in an east-west direction, on the other side they were parallel in a north-south direction and in registration so a continuous meander pattern crossing from side to side every 0.1 inch (2.54 mm) was created. Thus, if good plating in both lines and holes was achieved, the circuit produced will be continuous with good conductivity.

The panel was developed, catalyzed and plated as in Example 1F–1I. Plating was limited to 10 minutes in the priming bath and 30 minutes in the lower activity bath to test how well the holes were catalyzed. A layer of approximately 0.00005 inch (1.27) thick copper was produced. Conductivity testing showed the plated circuit to be continuous and fully conductive. The plating was continued to achieve the desired final total thickness.

EXAMPLE 14

This example illustrates use of a photosensitive adhesive layer to form a plated circuit without using a photodielectric layer to define the circuit pattern.

The adhesive composition of Example 1B was coated on 0.001 inch (25.4 microns) silicone release treated polyethylene terephthalate film to a coating weight of 70 mg/dm$^2$ (approximately 0.00025 inch [6.35 microns] thick). A temporary cover sheet of 0.0005 inch (12.7 microns) thick silicone release polyester (with higher release property than the support film) was laminated to the coating to provide a dry film structure as in Example 1E.

After laminating the adhesive film to a glass-epoxy substrate as described in Example 1E, the resulting element was exposed for 8 seconds through the polyester support using a positive phototool in the form of an electrical circuit pattern. The procedure of example 1F was followed.

After removing the support film, the exposed element (corresponding to FIG. 9) was toned with Monal ® alumina as described in Example 1C. The catalytic receptor particles partially embedded only in the tacky areas on the adhesive surface that were not hardened by exposure (see FIG. 10).

Figure 11:
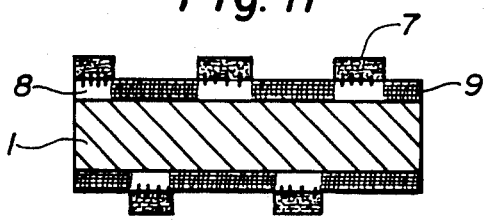
FIG. 11 shows electrolessly plated metal 7 adherently bound to the unexposed, unhardened areas 8 by means of the receptor particles 3.

Two-step catalysis and electroless plating were carried out as described in Example 1G–1I to achieve a copper thickness of approximately 0.0005 inch (12.7 microns) (FIG. 11). Conductivity and adhesion were good.

EXAMPLE 15

This example illustrates use of a hardenable adhesive composition comprised solely of a polymer having residual unsaturation, i.e., without added crosslinking components such as polyfunctional monomers, thermosetting resins or initiators.

The adhesive was prepared as a dry film by coating a methylene chloride solution of Hycar ® 1472X26, a carboxy-modified synthetic rubber, on silicone release treated polyester support to a coating weight of 245 mg/dm$^2$, a thickness of approximately 0.0008 inch (20.3 microns). Silicone release polyester film with higher release properties was used as a temporary cover sheet as in Example 14. The adhesive was laminated to black glass-epoxy substrate using equipment and methods of Example 1E.

After removing the polyester film, the surface of the laminated adhesive was toned with Monal ® alumina as described in Example 1C and the adhesive layer cured by passing the toned element through the PC-7100 ultraviolet processor at a control setting of 30, as outlined in Example 1D. This corresponds to a travel speed of 13.3 feet per minute (6.76 cm/sec). A Tempilabel ® on the sample showed the element attained a maximum temperature of 240° F. (116° C.). Curing was confirmed by subjecting an ultraviolet treated sample to methyl chloroform spray development as in Example 1F. The cured, toned adhesive layer was not removed, while the adhesive layer on an otherwise identical but uncured sample was removed completely by the methyl chloroform.

Two-step catalysis and electroless plating of the cured, toned panel was conducted as in Example 14. Plating was carried out for 16 hours in the second, low activity bath. The plated sample was rinsed, treated with benzotriazole solution and baked at 150° C. for one hour. Good plating and adhesion was obtained.

EXAMPLE 16

This example illustrates electroless plating using a nickel bath.

A. Preparation and Toning of Substrate—An unclad glass-epoxy panel was cleaned and prepared for coating as outlined in Example 1A, then coated with the adhesive composition and hot toned with Monal ® 300 alumina powder as in Example 2.

B. Definition and Catalysis of Circuit Lines—The photodielectric composition of Example 1 was laminated, exposed and developed as described, producing a circuit pattern corresponding to FIG. 5 with partially embedded catalytic receptors at the bottom of channels defined by the exposed photodielectric. The microporous particles were catalyzed with metallic palladium using a one step Cataposit ® 44 bath as described in Example 4.

C. Plating—A commercial nickel bath, Nickelmerse ® AL (Lea Ronal, Freeport, NY) was used. It was prepared by mixing 20 parts of Nickelmerse ® AL-A (contains nickel sulfate, ammonium hydroxide and other components), 10 parts of Nickelmerse ® AL-B (contains sodium hypophosphite) and 70 parts of distilled water. The bath was operated at a temperature of 120° F. (49° C.) and pH 8.5 for 10–60 minutes, depending on the thickness of nickel deposit desired. A plating rate of about 0.0004 inch/hour (10.2 microns/hr) was achieved. A conductive nickel deposit corresponding to FIG. 8 was obtained.

EXAMPLE 17

This example illustrates electroless plating inside through holes without previously anchoring receptor particles within the holes.

A Preparation and Toning of Substrate—A 0.025 inch (635 microns) thick ceramic substrate as described in Example 9A. having a pattern of laser drilled holes of 0.010 inch (254 microns) diameter was mounted as a "face plate" on a hollow chamber in such a way that an air tight seal, except for the holes in the substrate, was obtained. The chamber was connected to a source of low pressure compressed air. With the chamber pressurized, the adhesive composition of Example 2B was sprayed onto the ceramic substrate by means of an air brush. The panel was then dried as in Example 2B and adhesive was applied to the opposite side of the panel in the same way. The panel was then toned on one side with Monal ® 300 alumina powder as in Example 2C. Before and after toning the second side, any loose alumina particles were blown from the holes with a jet of compressed air. The resulting panel had a uniform layer of partially embedded alumina particles on both sides but no powder in the holes.

B. Definition and Catalysis of Circuit Lines and Pads—The photodielectric composition of Example 1 was laminated, exposed and developed as described, producing a circuit pattern corresponding to FIG. 5 with partially embedded catalytic receptors at the bottom of channels defined by the exposed photodielectric. The microporous particles were catalyzed with metallic palladium using the two step process described in Example 9.

C. Plating—Copper was plated to a thickness of 0.001 inch (25.4 microns) by the two step electroless process of Example 1. Uniform, conductive circuits with good adhesion, having good coverage and conductivity in the holes, were produced. The process can also be carried out on substrates of glass-epoxy as well as alumina, with substrate thicknesses from 0.010 to 0.070 inch (0.254 to 1.78 mm) and with through hole diameters of 0.008 to 0.018 inch (0.203 to 0.457 mm). It is believed that good plating was achieved within the holes because sufficient catalyst remains on the rough hole walls and was not washed off. Within the holes it is also protected from washing relative to surface catalyst.

We claim:

1. A laminate for the preparation of printed circuits by electroless plating of conductive metal thereon which comprises
   a. a substrate
   b. at least one surface of the substrate having an adherent layer of polymeric adhesive, having partially embedded therein finely divided microporus particles of adsorbent which protrude from the adhesive surface away from the substrate, the protrusive surfaces of which are adsorptive with respect to electroless plating catalysts or reductive precursors thereof, and
   c. a solid layer of photodielectric adherently overlying the layer of adhesive and adsorbent particles.

2. The laminate of claim 1 in which the substrate is inorganic.

3. The laminate of claim 2 in which the substrate is alumina.

4. The laminate of claim 1 in which the substrate is an organic polymer.

5. The laminate of claim 1 in which the substrate is a composite.

6. The laminate of claim 1 in which the substrate is a glass-filled network resin.

7. The laminate of claim 1 in which the adsorbent is microporous alumina.

8. The laminate of claim 1 in which the photodielectric layer is a dry film photodielectric.

9. The laminate of claim 1 in which the photodielectric is a dried layer of liquid photodielectric.

10. The laminate of either claim 6 or 7 in which the photodielectric is nonaqueously developable.

11. The laminate of claim 1 in which the adsorptive surfaces have been rendered catalystic by adsorption thereon of an electroless plating catalyst prior to applying the photodielectric layer.

12. The laminate of claim 6 in which the photodielectric layer is protected by a strippable cover sheet.

13. A method for making a laminate for the preparation of printed circuits by electroless plating of conductive metal thereon which comprises the sequential steps of
   1. forming an adherent layer of crosslinkable polymeric adhesive on at least one surface of a substrate;
   2. toning the layer with finely divided microporous, particles of adsorbent so that they become partially embedded within and protrude form the surface of the adhesive, the surfaces of the protruding part of the particles being adsorptive with respect to electroless plating catalysts or reductive precursors thereof;
   3. crosslinking the polymer adhesive to harden the layer and firmly hold the embedded particle surfaces; and
   4. applying a layer of photodielectric to the layer of crosslinked adhesive and protrusive adsorbent particles.

14. The laminate of claim 1 in which the substrate contains a plurality of through holes.

15. The laminate of claim 1 in which have an adherent layer (b) and an overlying layer of photodielectric (c).

* * * * *